United States Patent
Hayes

(10) Patent No.: US 6,983,432 B2
(45) Date of Patent: Jan. 3, 2006

(54) CIRCUIT AND METHOD FOR MODELING I/O

(75) Inventor: Jerry D. Hayes, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 157 days.

(21) Appl. No.: 09/683,546

(22) Filed: Jan. 16, 2002

(65) Prior Publication Data

US 2002/0188915 A1 Dec. 12, 2002

Related U.S. Application Data

(60) Provisional application No. 60/288,813, filed on May 4, 2001.

(51) Int. Cl.
*G06F 17/50* (2006.01)

(52) U.S. Cl. .................. 716/4; 703/2; 703/14; 716/6

(58) Field of Classification Search .............. 716/4; 703/2, 14
See application file for complete search history.

(56) References Cited

U.S. PATENT DOCUMENTS

| | | | |
|---|---|---|---|
| 5,467,291 A * | 11/1995 | Fan et al. ............. | 703/14 |
| 5,481,484 A | 1/1996 | Ogawa et al. | |
| 5,535,146 A | 7/1996 | Huang et al. ......... | 364/578 |
| 5,652,716 A | 7/1997 | Battersby ............. | 364/578 |
| 5,675,502 A | 10/1997 | Cox .................... | 364/490 |
| 5,692,158 A * | 11/1997 | Degeneff et al. ..... | 703/2 |
| 5,692,160 A * | 11/1997 | Sarin .................. | 703/23 |
| 5,696,694 A | 12/1997 | Khouja et al. ........ | 364/488 |
| 5,706,477 A | 1/1998 | Goto ................... | 395/500 |
| 5,757,679 A | 5/1998 | Sawai et al. | |
| 5,757,697 A | 5/1998 | Briner ................. | 364/578 |
| 5,838,947 A | 11/1998 | Sarin .................. | 395/500 |
| 5,920,489 A | 7/1999 | Dibrino et al. ....... | 364/578 |
| 5,949,983 A | 9/1999 | Baxter ................ | 395/500 |
| 6,005,829 A | 12/1999 | Conn .................. | 368/118 |
| 6,028,995 A * | 2/2000 | Jetton et al. ......... | 716/3 |
| 6,035,115 A | 3/2000 | Suzuki ............. | 395/500.36 |
| 6,041,169 A * | 3/2000 | Brennan .............. | 716/6 |
| 6,080,201 A | 6/2000 | Hojat et al. .......... | 703/14 |
| 6,102,960 A | 8/2000 | Berman et al. | |
| 6,110,219 A | 8/2000 | Jiang .................. | 716/1 |
| 6,584,606 B1 * | 6/2003 | Chiu et al. ........... | 716/10 |
| 6,618,837 B1 * | 9/2003 | Zhang et al. ......... | 716/4 |
| 2002/0183990 A1 * | 12/2002 | Wasynczuk et al. ... | 703/2 |

OTHER PUBLICATIONS

Stievano et al., Parametric Macromodels of Digital I/O Ports, IEEE Transactions on Advanced Packaging, pp. 255-264, May 2002.*

Stievano et al., Behavioral Modeling of Digital IC Input and Output Ports, Electrical Performance of Electronic Packaging, pp. 331-334, Oct. 2001.*

(Continued)

*Primary Examiner*—A. M. Thompson
(74) *Attorney, Agent, or Firm*—Richard M. Kotulak

(57) ABSTRACT

A behavioral modeling technique that captures driver delay. The output characteristics of a typical driver are represented by two basic element types: switching and non-switching. Switching elements are functions of both time-varying and non-time-varying parameters, and non-switching elements are functions of non-time-varying parameters only. The outputs of these elements are characterized and tabulated by applying a DC voltage on the output of the driver and measuring the current through each element. The time-varying switching element are represent by time-controlled resistors. The invention provides a methodology to account for variations in input transition rate, supply voltage(s) or temperature.

28 Claims, 13 Drawing Sheets

OTHER PUBLICATIONS

P.F. Tehrani et al., Extraction of Transient Behavioral Model of Digital I/O Buffers from IBIS, Proceedings of Electronic Components and Technology Conference, pp. 1009-1015, May 1996.*

T. Zak et al., An Experimental Procedure to Derive Reliable IBIS Models, Proceedings of the 3rd Electronics Packaging Technology Conference, pp. 339-344, Dec. 2000.*

Y. Wang et al., The Development of Analog SPICE Behavioral Model Based on IBIs Model, Proceeedings of the Ninth Great Lakes Symposium on VLSI, pp. 101-104, Mar. 1999.*

J. D. Hayes et al., Behavioral Modeling for Timing, Noise, and Signal Integrity Analysis, IEEE Conference on Custom Integrate Circuits, pp. 353-356, May 2001.*

J.D. Hayes et al., Using Voltage and Temperature Adders To Account for Variations in Operating Conditions During Digital Timing Simulation, Tenth Annual IEEE International ASIC Conference and Exhibit, pp. 348-351, Sep. 1997.*

B. Ackalloor et al., An Overview of Library Characterization in Secmi-Custom Design, IEEE 1998 Custom Integrated Circuits Conference, pp. 305-312, May 1998.*

I.S. Stievano et al., Behavioral Modeling of Digital IC Input and Output Ports, Electrical Performance of Electronic Packaging, pp. 331-334, Oct. 2001.*

Ying Wang et al., The Development of Analog SPICE Behavioral Model Based on IBIS Model, Proceedings of Ninth Great Lakes Symposium on VLSI, pp. 101-104, Mar. 1999.*

IBIS, I/O Buffer Information Specification, [online]. [retrieved on Aug. 26, 2004]. Retrieved from the Internet<http:www.vhdl.org/pub/ibis/ver3.2.doc>.*

Bina Ackalloor, Dinesh Gaitonde, "An Overview of Library Characterization in Semi-Custom Design" May 1997 IEEE 1998 Custom Integrated Circuits Conference, pp. 305-312.

Chandrakasan et al., "Design of High-Performance Microprocessor Circuits" ISBN 0-7803-6001-X, IEEE Order No. PC5836, Chapter 16.3 pp. 338-345.

Jessica Qian, et al., "Modeling the 'Effective Capacitance' for the RC Interconnect of CMOS Gates" Dec. 1994, vol. 13. No. 12, IEEE Transactions on Computer-Aided Design of Integrated Circuits and Systems pp. 1526-1535.

* cited by examiner

| TABLE NFET ON SCALAR | |
|---|---|
| Time | Value |
| -5 | 10000 |
| 0 | 10000 |
| 1 | 5 |
| 2 | 1 |
| 10 | 1 |

| TABLE PFET OFF SCALAR | |
|---|---|
| Time | Value |
| -5 | 1 |
| 0 | 1 |
| 1 | 5 |
| 2 | 10000 |
| 10 | 10000 |

TABLE NFET ON SCALAR
| Time | Value |
|---|---|
| -5 | 10000 |
| 0 | 10000 |
| 1 | 5 |
| 2 | 1 |
| 10 | 1 |

TABLE PFET OFF SCALAR
| Time | Value |
|---|---|
| -5 | 1 |
| 0 | 1 |
| 1 | 5 |
| 2 | 10000 |

FIG. 5A
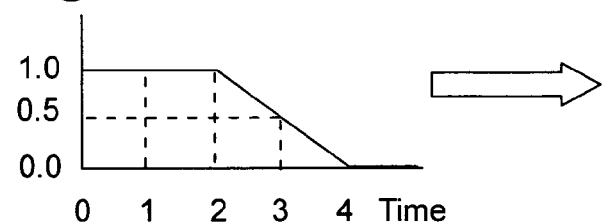
FIG. 5B
Bio Model
| Scalar | |
|---|---|
| Time | Value |
| 0 | 1.0 |
| 1 | 1.0 |
| 2 | 1.0 |
| 3 | 0.5 |
| 4 | 0.0 |
FIG. 5C
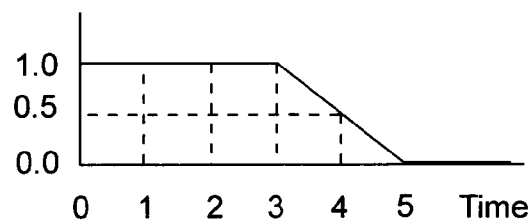

CIRCUIT AND METHOD FOR MODELING I/O

This invention claims priority based on Provisional Patent Application No. 60/288,813 filed on May 4, 2001.

BACKGROUND OF THE INVENTION

This invention relates to methods and systems used for generating behavioral models used in integrated circuit design. More particularly, the present invention provides for a new behavioral model that provides timing, noise and integrity grid analysis.

When simulating I/O electrical performance during timing characterization, signal integrity analysis, and power grid integrity analysis, various I/O modeling techniques have been used. At one end of the modeling spectrum are the full netlist models that contain detailed architectural and parasitic information of the I/O. These models provide the highest level of accuracy and can be used for a variety of analysis. A major disadvantage of full netlist models are excessive simulation times that prohibit them from being used at the chip level and non-convergence under certain conditions. At the other end of the spectrum are empirical models for driver delay and IBIS models for signal integrity analysis.

Empirical models use simple equations or lookup tables for predicting driver delay and output slew rate. The advantage of empirical models is fast simulation time. The disadvantages are poor accuracy under certain conditions, and they are typically limited to timing analysis. For signal integrity analysis IBIS models can be used. The advantage of these models are accurate driver output waveforms across a wide range of loading conditions. The disadvantages are they cannot be used for timing analysis and the models do not predict driver sensitivity to variations in supply voltage, temperature, and input slew rate.

I/O behavioral modeling in the form of IBIS models has gained wide acceptance in signal integrity analysis. While the IBIS model accurately represents the characteristics of the output pin at three fixed process corners, it does not model driver delay or account for variations in temperature, supply voltages, and input transition rate. The IBIS models used today by various board level simulation tools for signal integrity analysis are behavioral in nature and offer the user and developer of the models several advantages over full-netlist models. First, because IBIS models are behavioral, they contain no proprietary information. This makes it easy to exchange information about I/O characteristics without disclosing intellectual property. Second, behavioral simulation is faster than full-netlist simulation (e.g., Spice) because it uses higher-level abstraction models. What would be prohibitive in terms of simulation time when using full-netlist models can be accomplished in reasonable time with behavioral models.

The IBIS specification (ANSI/EIA-656-A, "I/O Buffer Information Specification (IBIS) Version 3.2", September 1999), presents several techniques for improving model accuracy across a wide range of I/O family types for signal integrity analysis. I/O behavior modeling (e.g. IBIS I/O Buffer Information Specification) have been used by industry in PCB level signal integrity tools such as SpectraQuest from Cadence and XTK from Viewlogic for several years.

BRIEF SUMMARY OF THE INVENTION

Unfortunately, the IBIS techniques do not model driver delay, pre-drive currents, or n-well decoupling structures which would be required for timing, noise, and power grid integrity analysis. In addition, no techniques are available to the IBIS model developer to account for variations in temperature, supply voltages, and input transition rate. This invention provides a new and powerful behavior model that overcomes the IBIS limitations and is appropriate for merged digital-analog timing, noise, and power grid analysis.

A new modeling technique provided by this invention preserves the accuracy of the full netlist model, simulates orders of magnitude faster, and can be used for timing, power grid integrity, and signal integrity analysis over a wide range of supply voltage(s), temperature, input slew rate, and loading conditions. Because of the relative simplicity of this new modeling technique as compared to a full netlist model, non-convergence issues at run time are ameliorated.

Additional advantages of this invention are 1) the behavioral model provided here captures driver delay, thereby allowing on-chip and off-chip timing to be merged into a seamless interface, 2) I/O current waveforms are readily available for on-chip power grid integrity analysis, and 3) signal integrity analysis at the chip level is available without the need of procuring othere software. Furthermore, the behavioral model provided by this invention can be used to enhance other applications that currently perform package noise analysis using full netlist models which greatly limits the cross sectional size it can analyze at one time. These advantages enable these models, herein referred to as "RIO" (Behavioral I/O) models, to form a seamless interface between on-chip and off-chip timing. They can also provide accurate rail current waveforms for power grid analysis tools and I/O placement tools. Because RIO models have the ability to handle ground bounce and power supply collapse, they can also be used in signal integrity tools.

In order to accomplish this invention provides a method for modeling the inputs and outputs of integrated circuits, comprising the steps of representing in the model the output characteristics of driver circuits by two types of elements, switching and non-switching; tabulating the output characteristics for each of the elements by applying a DC voltage source on the output of the driver and measuring the current through each element; representing in the model switching elements as a voltage-time controlled resistors by obtaining the product of DC impedance as a function of voltage and a scalar that is a function of time; and embedding in the model equations that are functions of input edge arrival times and cycle time for each scalar type.

The circuit used for modeling comprises switching elements connected serially as voltage-time controlled resistors; one of the conductive elements acts to pull voltage up, while the other conductive elements acts to pulls the voltage down; and non-switching elements connected serially as resistors, one representing power structures and the other representing ground clamping structures; each of the switching elements is tied to input stage and both the switching and non-switching elements is tied to an output.

BRIEF DESCRIPTION OF THE DRAWINGS

FIG. 5a illustrates the determination scalar values as a function of time at some fixed voltage and temperature denoted by Env1.

FIG. 5b illustrates how the scalars values from FIG. 5b are represented in tabular format within the BIO model.

FIG. 5c is simple illustration of how these scalar values might change due to variations in voltage, temperature, and input slew rate denoted by Env2.

DETAILED DESCRIPTION OF THE INVENTION

The output characteristics of a typical driver are represented by two basic element types: switching and non-switching. Switching elements are functions of both time-varying and non-time-varying parameters, and non-switching elements are functions of non-time-varying parameters only. Examples of switching elements are nfets and pfets. Typically, a switching element is used to represent the composite transient impedance (conductance) behavior of a pull-up or pull-down network that are comprised of multiple FETs and parasitics. Examples of non-switching elements are resistive termination's and ESD structures. ESD impedance (conductance) is essentially a function of device voltage only and can therefore can be treated as a non-switching element. There are, however, ESD structures that can be dynamically switched that would require a switching element to represent its impedance.

Figure 1:
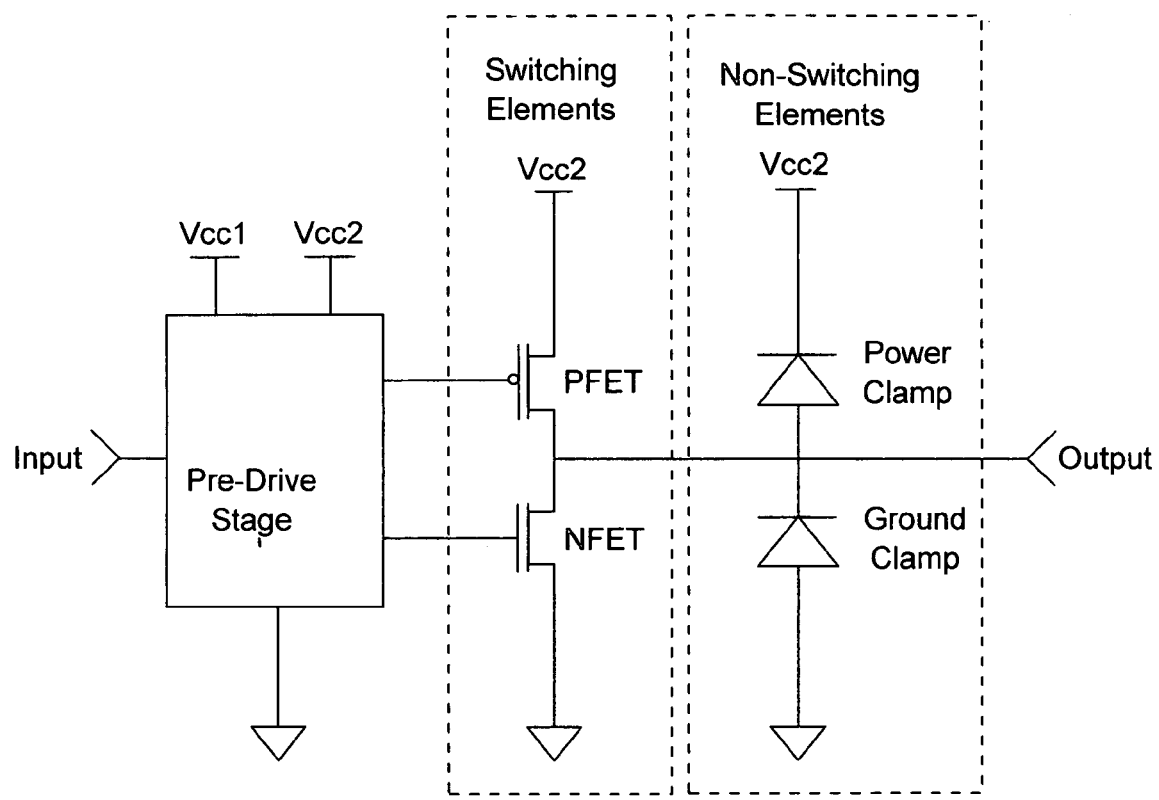
FIG. 1 illustrates an example driver structure used to illustrate the characterization techniques of both switching and non-switching elements.

FIG. 1 illustrates an example driver structure used to illustrate the characterization techniques of both switching and non-switching elements. These techniques can easily be extended to other I/O structures containing devices that can be classified as either switching or non-switching.

The first step is to characterize the dc impedance for each element in FIG. 1 at a fixed temperature and supply voltage. This impedance, which we call the dc_base impedance, is tabulated as a function of device voltage. To account for variations in temperature and supply voltages, device impedance can be obtained from the dc_base according to equation (1) below.

$$\text{dc\_impedance} = (1+D0) * \text{dc\_base} \quad (1)$$

The value for D0 is calculated prior to simulation time using an empirical equation which is a function of both temperature and supply voltage. The sensitivity this parameter has to device voltage is small, allowing the use of a simple scalar technique across the full range of dc_base impedance values.

For each element type, it's dc impedance as a function of the voltage across it is tabulated as shown in Table 1 below:

TABLE 1

| TABLE DC POWER CLAMP | | TABLE DC GROUND CLAMP | |
|---|---|---|---|
| Vpowerclamp | Resistance | Vgroundclamp | Resistance |
| 0 | 10000 | 0 | 10000 |
| 0.7 | 100 | 0.7 | 100 |
| 5 | 1 | 5 | 1 |
| TABLE DC PFET | | TABLE DC NFET | |
| Vpfet | Resistance | Vnfet | Resistance |
| 10 | 40 | 5 | 40 |
| 5 | 42 | 0 | 42 |
| 0 | 43 | −5 | 43 |

In addition to dc impedance, for each switching type of element, the turn-on and turn-off rates are characterized by observing the transient impedance during rising and falling output waveforms.

Figure 2A:
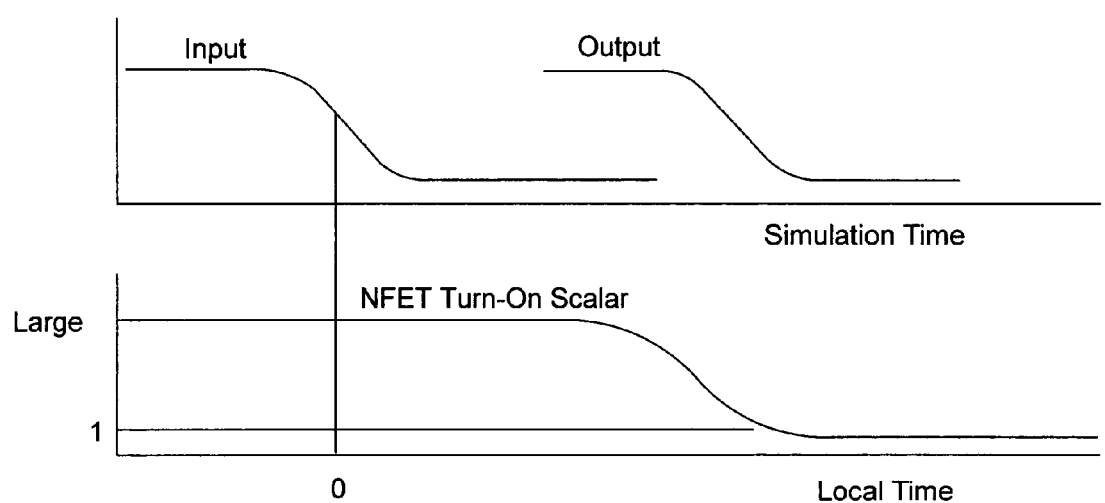
FIG. 2a illustrates waveforms for characterizing the NFET turn-on characteristics of a driver.
Figure 2B:
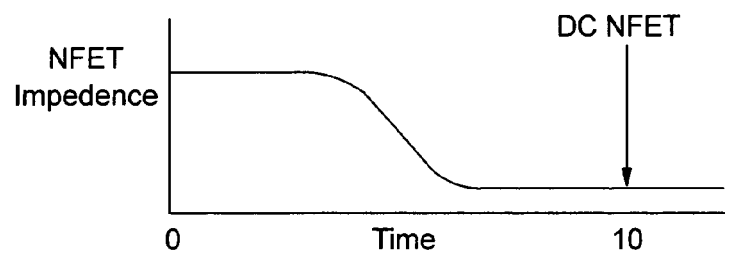
FIG. 2b illustrates characterization of the nfet turn-on and pfet turn-off rates.
Figure 2B:
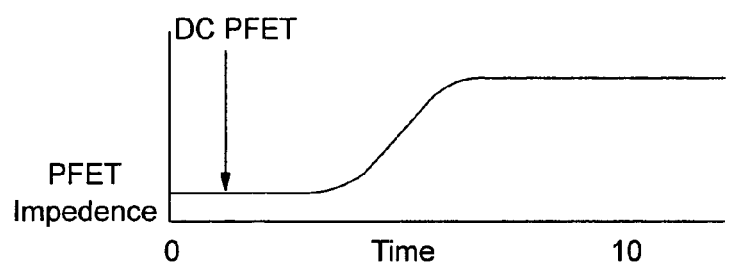
Figure 2C:
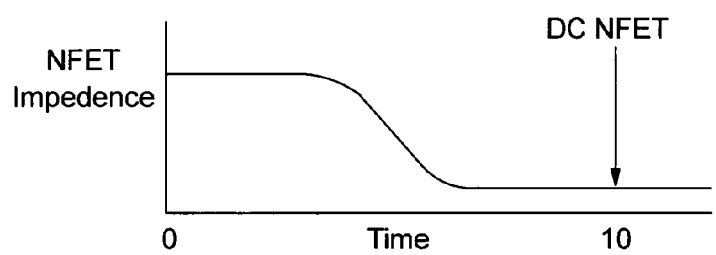
FIG. 2c illustrates the characterization of the pfet turn-on and nfet turn-off rates represented as scalars values as a function of time.
Figure 2C:
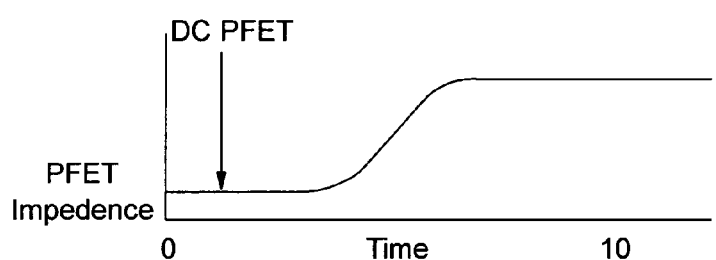

FIG. 2a illustrates waveforms for characterizing the NFET turn-on characteristics of a driver. The transient impedance of the NFET turning on is a function of device voltage and of "local time", that begins at the midpoint of the input transition. Normalizing the transient impedance to the dc impedance (function of device voltage) produces a time-varying scalar representing the turn-on rate of the NFET, independent of the load that was used during characterization. This scalar is unity when the NFET is completely turned on, and very large when the NFET is off. For this same transition and same "local time", another time-varying scalar is obtained for the PFET turn-off. Similarly, a different "local time" for the output-rising transition is used as the basis for PFET turn-on and NFET turn-off scalars. This collection of four scalars is saved in tabular format. FIG. 2b illustrates characterization of the nfet turn-on and pfet turn-off rates. FIG. 2c illustrates the characterization of the pfet turn-on and nfet turn-off rates represented as scalar values as a function of time.

In order to enable behavioral simulation of periodic waveforms, the "local times" are made periodic through their definitions as functions of periodic rising and falling input edge arrival times. The time indexing of each scalar is unique. For example, the zero time reference for the nfet_on and pfet_off scalars corresponds to the time a falling input wave crosses it's midpoint while the nfet_off and pfet_on scalars correspond to a rising input wave. The four equations below, one for each scalar type, control the time indexing of the scalars.

$$\textit{pfet\_on\_time} = \text{mod}((\text{time}+\text{period}-\text{fall}), \text{period}) - ((\text{period}*(1-\text{edge})) + \text{rise}-\text{fall})$$

$$\textit{pfet\_off\_time} = \text{mod}((\text{time}+\text{period}-\text{fall}), \text{period})$$

$$\textit{nfet\_on\_time} = \text{mod}((\text{time}+\text{period}-\text{rise}), \text{period}) - ((\text{period}*\text{edge}) - \text{rise}+\text{fall})$$

$$\textit{nfet\_off\_time} = \text{mod}((\text{time}+\text{period}-\text{rise}), \text{period})$$

where time=simulation time parameter period=time per cycle rise=rising input edge arrival time fall=falling input edge arrival time edge=0 if fall>rise and 1 if rise>fall Other timing schemes can be used. They will likely have both advantages and disadvantages over the equations enumerated above.

Figure 3:
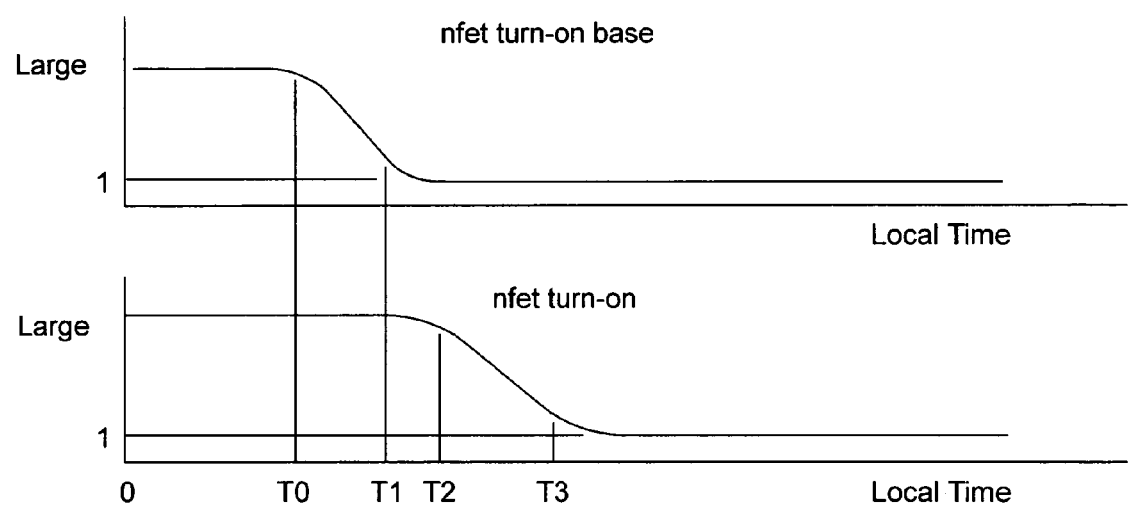
FIG. 3 illustrates sensitivity to variable parameters such as temperature for a NFET turn-on scalar.

While the "local times" are now periodic, they do not yet account for variations in input transition rate, supply voltage(s), or temperature. Sensitivity to these parameters is illustrated in FIG. 3 for the NFET turn-on scalar. The waveform NFET turn-on base represents the NFET turn-on scalar as generated at the base input transition rate, supply voltage(s), and temperature. As these parameters vary, the scalar further varies as the waveform NFET turn-on; only the time scale is changing, because the scalar is already normalized to its' dc impedance. This time scale change is implemented by defining a "modified local time" with a piece wise-linear monotonic relationship to the original local time. The "modified local time" has a delay K7 and a change in slope K8, with parameter K9 initiating the slope change. The K7 through K9 parameters are defined from the timing points in FIG. 3 according to the equations (2) below:

$$K7=T2-T0$$

$$K8=[(T3-T2)-(T1-T0)]/(T1-T0)$$

$$K9=T2 \quad (2)$$

We next use K7–K9 to define "modified local time" as in the equation (3) below.

$$NFET\_on\_time\_mod=NFET\_on\_time+K7+$$

$$+K8*[\max(NFET\_on\_time-K9, 0)] \quad (3)$$

When (NFET_on_time>K2)→Adjust slope according to K1

Else→No adjustment to slope

Like the D0 parameter in equation (1), values for K7, K8, and K9 are calculated prior to run time using empirical equations which are functions of temperature, supply voltages, and input transition rate obtained from actual parameter values. If conditions at run time are the same as those used to generate the nfet turn-on base waveform in FIG. 3, then K7 and K8 are set to zero; otherwise, they are set to non-zero values to appropriately modify the time sequence parameter. The turn-on impedance of the NFET can now be represented as the product of the scalar (in this case the NFET turn-on scalar) which varies with "modified local time" and the NFET dc impedance.

To account for all these variations in each scalar, the scalar indexing equations listed above are modulated using the K1–K12 terms below as a function of supply voltage(s), temperature, and input slew rate.

$$pfet\_on\_time\_mod=pfet\_on\_time+(K1+K2* \\ (pfet\_on\_time-K3)$$

$$pfet\_off\_time\_mod=pfet\_off\_time+(K4+K5* \\ (pfet\_off\_time-K6)$$

$$nfet\_on\_time\_mod=nfet\_on\_time+(K7+K8* \\ (nfet\_on\_time-K9)$$

$$nfet\_on\_time\_mod=nfet\_off\_time+(K10+K11* \\ (nfet\_off\_time-K12)$$

Where Kxx=f{voltage, temperature, and input slew}

To account for dc fet impedance sensitivity to temperature and supply voltage changes, the dc impedance for each element in FIG. 2 is modulated using the K13–K16 terms below as a function of voltage and temperature.

$$power\_clamp\_dc\_mod=power\_clamp\_dc* \\ (1+K13)$$

$$ground\_clamp\_dc\_mod=groung\_clamp\_dc* \\ (1+K14)$$

$$pfet\_dc\_mod=pfet\_dc*(1+K15)$$

$$nfet\_dc\_mod=nfet\_dc*(1+K16)$$

The nfet and pfet impedance is given as $$Rpfet=[pfet\_dc\_mod]*[pfet\_on\_scalar]\| \\ [pfet\_dc\_mod] *[pfet\_off\_scalar]$$

$$Rnfet=[nfet\_dc\_mod]*[nfet\_on\_scalar]\| \\ [nfet\_dc\_mod]*[pfet\_off\_scalar]$$

where pfet_on_scalar=f{pfet_on_time_mod} nfet_on_scalar=f{nfet_on_time_mod} pfet_off_scalar=f{pfet_off_time_mod} nfet_off_scalar=f{nfet_off_time_mod}

The power and ground clamp impedance is given as

Rpwrclamp=power_clamp_dc_mod

Rgndclamp=ground_clamp_dc_mod

Again it should be emphasized that the use of PFETs and NFETS is just illustrative. The model can be used with any switching element that pulls up or pulls down voltage.

Figure 4A:
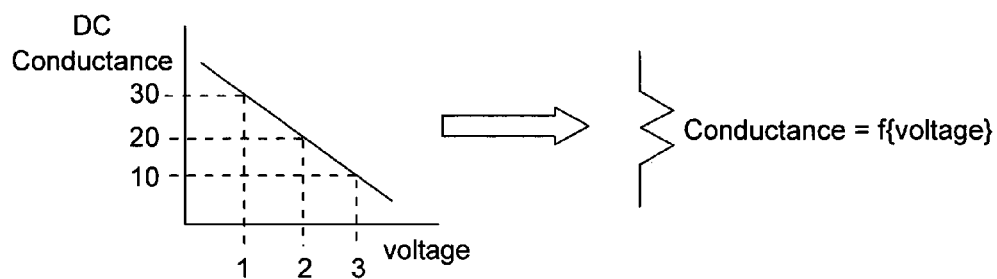
FIG. 4a illustrates how the DC conductance is obtained.
Figure 4B:
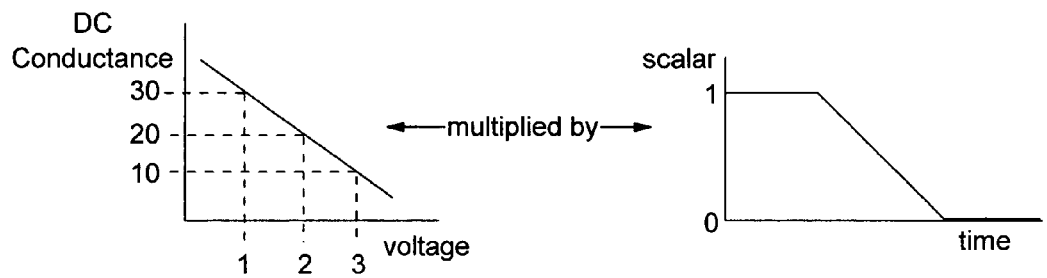
FIG. 4b illustrates how the transient conductance of a device is obtained.
Figure 4C:
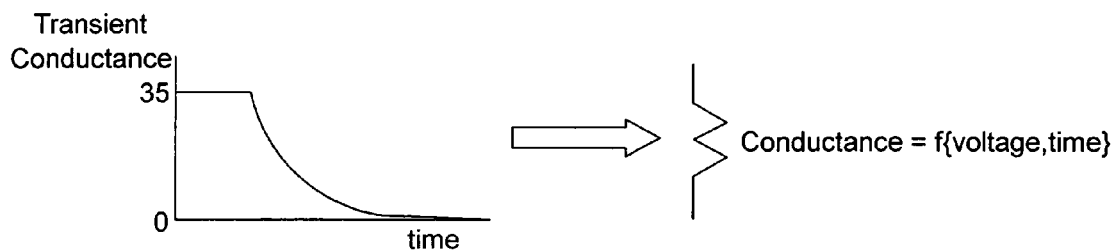
FIG. 4c illustrates the transient conductance of a device.

Alternatively, the model can use conductance versus impedance when creating the model. FIGS. 4a, 4b, and 4c help illustrate this. They provide examples of variable conductance as a function of device voltage and time. The same starting equation can be used in accounting for variations in temperature and supply voltages, except that conductance is substituted for impedance, i.e., dc conductance= (1+D0)*dc base, where D0 is a function of supply voltage and temperature.

FIG. 4a illustrates how the DC conductance of a device is obtained. The DC conductance of a device (e.g. Pullup or Pulldown) is characterized as a function of device voltage. For this example, the conductance varies from 10–35 over a device voltage range of 0–3 volts.

FIG. 4b illustrates how the transient conductance of a device is obtained. To capture the transient conductance of the device, the DC conductance of the device is multiplied by a scalar that is a function of time. For this example the scalar ranges from 1, corresponding to when the device is turned on, to 0 when the device is turned-off. The scalar represents the rate at which the device turns off.

FIG. 4c illustrates the transient conductance of a device. The transient conductance of the device is shown to vary from 35, corresponding to when the device is on, to 0 when the device is off. Note that the transient conductance is a function of both device voltage and time. Note that time is referenced to the midpoint of the input signal. This synchronizes the input and output waveforms of the BIO model.

A simple example to illustrate the concept of a BIO model adjustment parameter based on conductance scalars and how it is handled within the BIO model is presented in FIGS. 5a, 5b and c. FIG. 5a illustrates the determination scalar values as a function of time at some fixed voltage and temperature denoted by Env1. FIG. 5b illustrates how the scalars values from FIG. 5b are represented in tabular format within the BIO model. FIG. 5c is simple illustration of how these scalar values might change due to variations in voltage, temperature, and input slew rate denoted by Env2.

The goal is to be able to use the scalar table (Scalar@Env1) within the BIO model to accurately reproduce the scalar values at Env2. To do this, we introduce a time shift parameter K0 such that . . .

Scalar@Env2(Time)=Scalar@Env1(Time−K0) where K0=1 for this example

K0=f{voltage, temperature, input slew rate}

With the appropriate value for K0 calculated prior to simulation, the scalar table within the BIO model can be adjusted for any time shift due to changes in voltage, temperature, and input slew rate.

Figure 6:
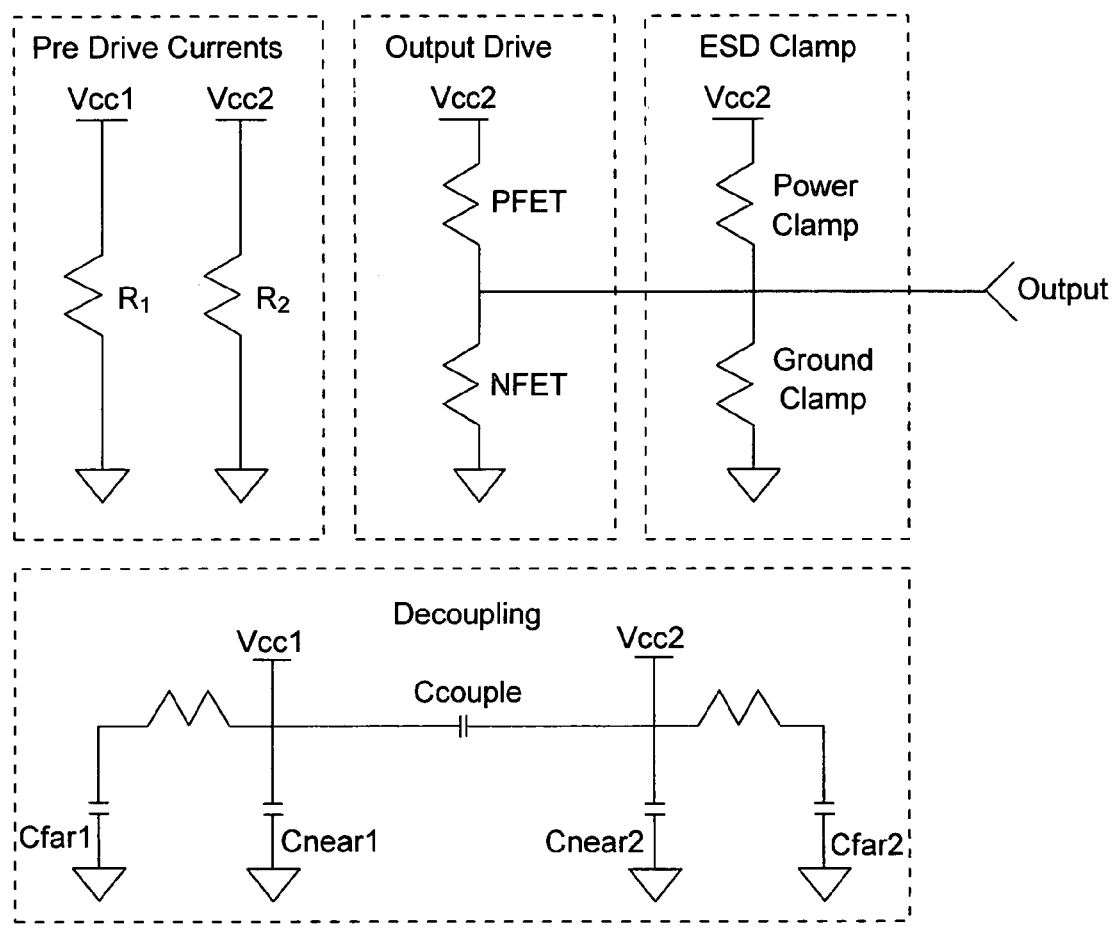
FIG. 6 illustrates the behavioral model topology provided by this invention.

FIG. 6 illustrates the behavioral model topology. The output drive stage consists of resistances which are functions of input edge arrival times, input transition rate, supply voltage(s), device voltage, and temperature representing the NFET and PFET as described above. The ESD stage contains resistances representing the power and ground ESD structures which are functions of supply voltage(s), device voltage, and temperature.

While the output drive and ESD clamp stages contain the behavioral characteristics necessary for timing and signal integrity analysis, the pre-drive current and decoupling stages contain additional behavioral characteristics necessary for noise and power grid integrity analysis. Each device within these stages can be represented by either a fixed-value element, a non-switching element that is a function of parameters not varying in time, or a switching element which is a function of both time and non-time varying parameters. A tradeoff between model complexity and accuracy typically defines the type of element used.

Figure 11:
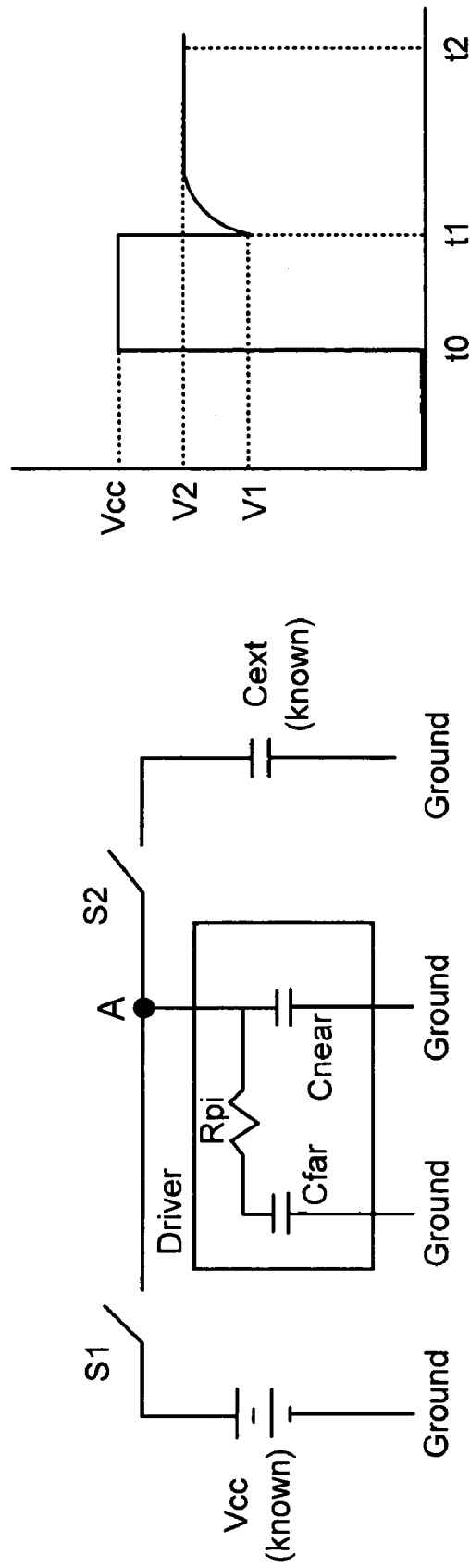
FIG. 11 illustrates a characterization of the decoupling stage of the model topology of FIG. 6.

There are many characterization techniques that we have developed for generating the data that describes the elements of the model. The I/O family type determines the appropriate techniques to use. Note that this only affects the data values that go into the model, not the model topology or algorithms. FIG. 11 illustrates one of the characterization techniques used for the decoupling stage. The method for characterizing the decoupling structure of FIG. 11 involves the following steps:

1) Switch S1 is closed at $t_o$ and charges node A to $V_{cc}$.
2) Switch S1 is open before $t_1$.
3) Switch S2 is closed at $t_1$.
4) From the waveform:

$C\text{near}=(V2*C\text{ext})/(V_{cc}-V1)$ $C\text{far}=(V2*(C\text{near}=C\text{ext})-V_{cc}*C\text{near})/(V_{cc}-V2)$ $R_{pi}$ is calculated from the RC time constant associated with the waveform going from V1 to V2 where $C=C\text{ext}+C\text{far}+C\text{near}$ and $R=R_{pi}$.

The I/O family type is also used to characterize the predrive stage. For this characterization, the supply current minus the output stage current is used to define the resistance (conductance) of the predrive in the equation as follows:

$R1(t)=Vcc1/Icc1$ and $R2(t)=Vcc2/(Icc2$−output stage current)

R1 and R2 are then recorded in tabular format within the model.

Typically there is good output waveform correlation among the "BIO" model of FIG. 6, IBIS models and full netlist models. Model accuracy begins to diverge after a change in voltage Vcc1 to the pre-drive circuits, temperature, and input transition rate. While the BIO model and full netlist models track across a wide range of conditions, the IBIS model is unable to adjust for varying conditions. When the output supply voltage Vcc2 is also allowed to change, IBIS model inaccuracies typically increase further. The high level of correlation between the BIO model and the full-netlist model permits BIO models use in both timing and signal integrity analysis. For a given I/O the same BIO model can be used across a wide range of conditions for signal integrity analysis, unlike an IBIS model that is only valid at a fixed voltage, temperature, and input slew rate. This, together with the BIO model's ability to capture driver delay and power grid current waveforms, makes BIO models much more versatile and suitable for an ASIC environment.

The equation overhead and six resistive element BIO model (2 static elements, 2 pfet elements, and 2 nfet elements) shown in FIG. 6 exhibit outstanding accuracy across a wide range of voltage, temperature, input slew rate, and off-chip net conditions and has been demonstrated across a wide range of I/O family types (e.g. CMOS, PECL, LVDS, GTL, etc,.) In addition whether being used for timing, noise, or signal integrity analysis, the BIO model's simulation times are typically less than 1% of the simulation time required for full-netlist models. The difference in simulation time becomes even more pronounced for increasingly complex I/O's. The reason is because the complexity of the behavioral model remains essentially constant as the complexity or size of the full netlist model increases. This makes possible a merger of analog and digital simulation techniques at the chip level.

Figure 7:
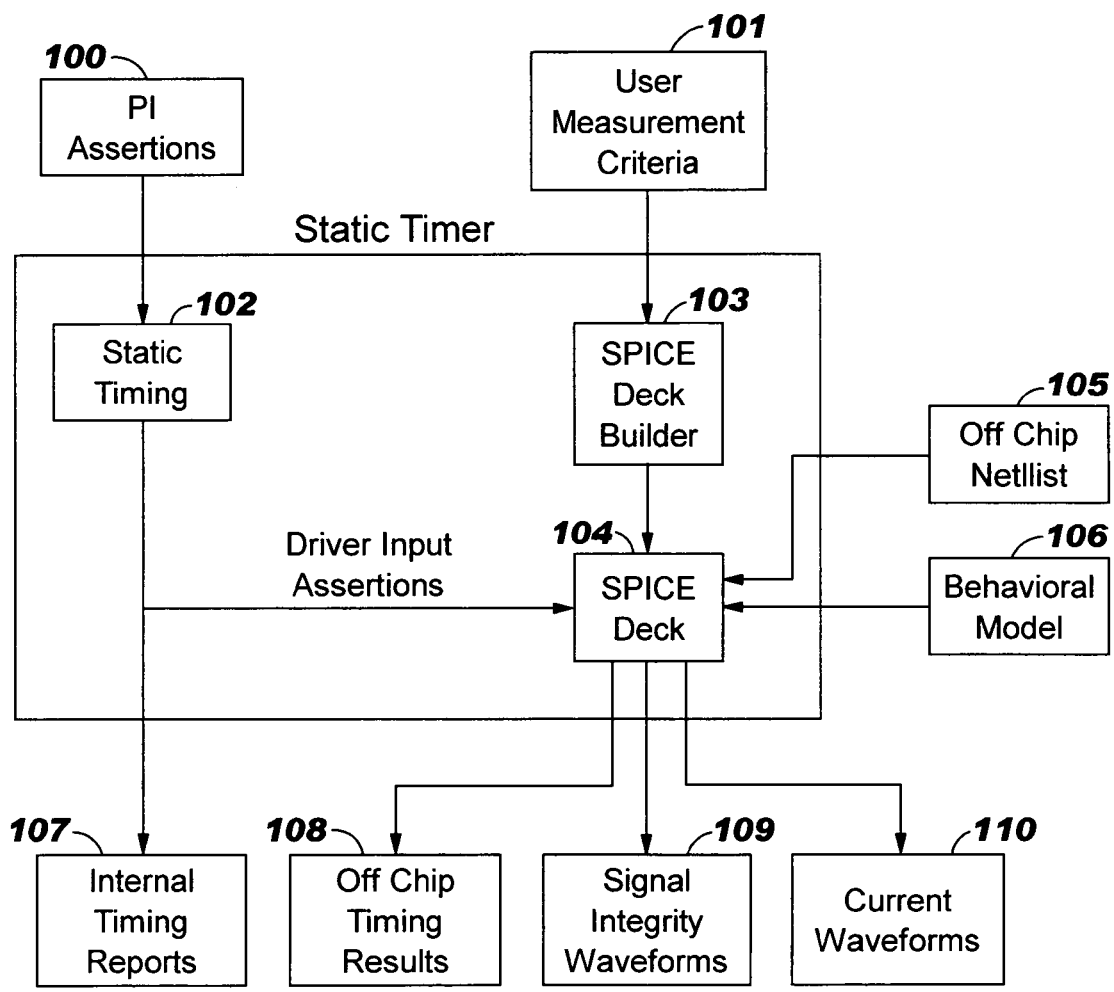
FIG. 7 illustrates a static timer using the BIO model of this invention.

Using the behavioral model of FIG. 6, the static timer can merge on-chip and off-chip timing, perform signal integrity and perform I/O power grid integrity analysis as illustrated in FIG. 7. The scope of internal chip static timing has historically ended at the silicon-package boundary. At this boundary various techniques have been used to manually interface internal chip timing with off-chip timing that trade accuracy with simulation run time. The most accurate technique is to use a static timer to determine edge arrival times at the input of the driver and then in a separate spice run that uses full spice netlist representations of the driver and off-chip net, determine delay from the input of the driver to the sink end of the net. The advantages of this approach are accurate off chip timing and the ability to perform signal integrity analysis. The disadvantages are 1) excessive run times when simulating full spice netlist I/O models that prohibit this technique from being applied at the chip level timing, 2) manual effort is required to merge on-chip timing with off-chip timing, and 3) many customers do not have the required software licenses for simulating encrypted spice models.

A technique that trades accuracy for faster run time is to calculate a lumped load capacitance that represents the effective capacitance as seen by the driver and use this lumped load in an empirical timing model such as a NDR (New Delay Rule) for calculating driver delay during static timing. A spice run is then required to calculate off-chip net delay from the output of the driver to the sink end of the net. The advantages of this approach are fast run time and reasonable driver delay accuracy assuming the effective capacitance was calculated correctly. The disadvantages of this approach are 1) the actual shape of the waveform at the output of the driver is not captured, therefore the input stimulus used during spice simulation of the network is incorrect and will affect accuracy, 2) this technique does not support signal integrity analysis, and 3) manual effort is required to merge on-chip and off-chip timing.

This invention provides one with the ability to embed spice behavioral models within a static timer such as EinsTimer licensed by IBM or other industry available static timers like PrimeTime by Synopsys and BuildGates by Cadence that preserve the accuracy of a full netlist model, run orders of magnitude faster, and gives the static timer the ability to do signal integrity and I/O power grid analysis with the accuracy of spice at the chip level. A static timer is used to time the internal logic up to the input of the driver in order to determine both the edge arrival time and slew rate to the driver. A spice deck builder within the static timer is used to build a spice deck that references both the driver's spice behavioral model and the spice netlist representing all parasitic and transmission line characteristics from the output of the driver to the sink end of the net. User defined measurement criteria such as voltages thresholds for delay measurements, frequency, number of cycles, and waveform observation points would be input to the deck builder that would control delay measurement and signal integrity analysis. Using the spice deck and the information of edge arrival time and slew rate to the driver, the static timer then invokes spice (e.g. PowerSpice) and simulates the entire net in a small fraction of the time as compared to simulating the entire net using full spice netlist I/O models. The spice run results are merged with static timing assertions by the static timer to form a seamless timing interface between on-chip and off-chip timing.

FIG. 7 illustrates how such a static timer can be combined with the BIO models to produce these results. Primary input (PI) assertions are used to define edge arrival time and slew rate at the input pins of the chip. The static timer uses the PI assertions (100), a chip level cell netlist, and on-chip parasitic information to perform a customary static timing analysis (102). The results of this analysis are available in the internal timing reports (107) that describes all path timing internal to the chip. Measurement criteria for off-chip timing and signal integrity analysis are defined (101) and used as input to the spice deck builder (103) within the static timer. The spice deck builder creates a spice deck (104) that references the off-chip spice netlist (105) and I/O behavioral model (106). Using the spice deck and driver input assertions from (102), the static timer invokes spice to simulate the off-chip net. From the spice simulation results, the static timer produces off-chip timing reports (108) for delay analysis, off-chip voltage waveforms (109) for signal integrity analysis, and I/O power grid integrity reports (110) using the current waveforms from the spice simulations and cell level decoupling information in the NDRs.

Figure 8:
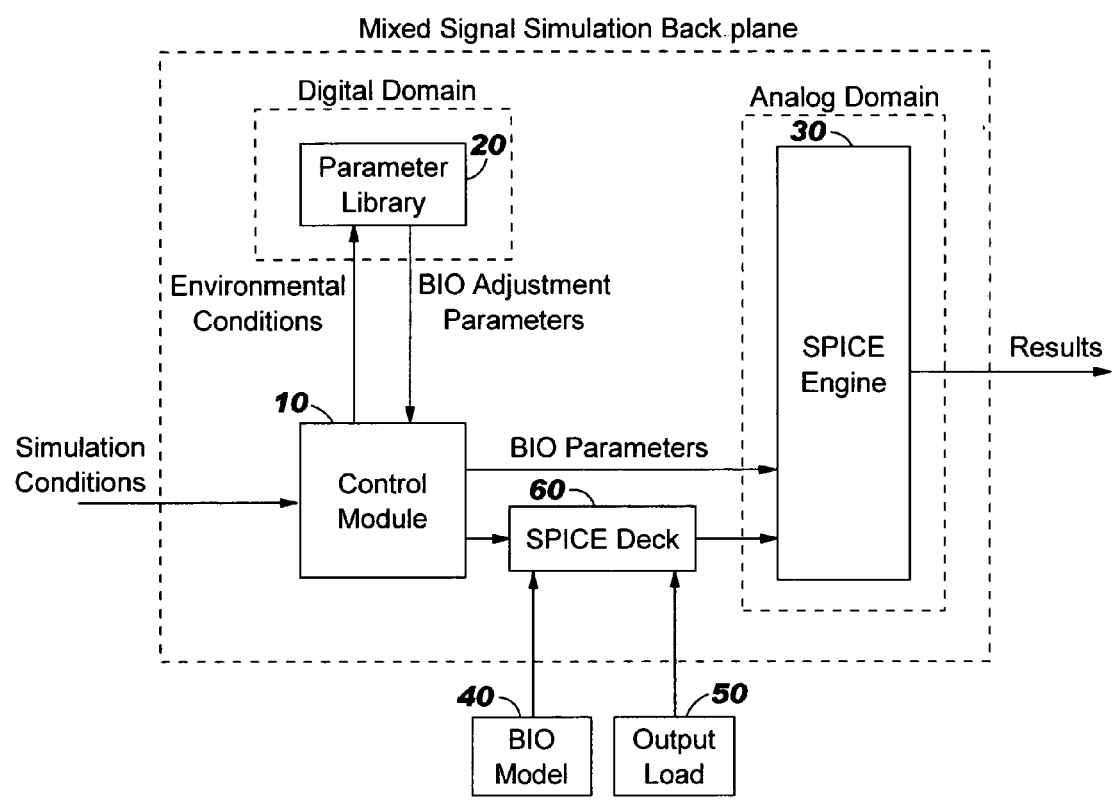
FIG. 8 illustrates the use of the BIO model in the mixed signal environment.

This invention also provides a mixed signal simulation environment using the BIO models. FIG. 8 illustrates the use of the BIO model in the mixed signal domain. The mixed signal simulation back plane consists of three basic components; a digital simulation domain 20, for example an NDR rule containing empirical equations for calculating gate delay, an analog simulation domain such as a SPICE or PowerSPICE simulation engine 30, and a control module 10 that merges the two simulation domains during analysis. All three elements are typically coded within the same software language environment (e.g., DCL ("Delay Calculator Language")) that allows the simulation back plane to be ported across multiple operating systems such as RS6000 AIX, Solaris, HP, and Linux. By definition of a back plane, this mixed signal simulation capability can be exploited by multiple applications. One example is accurate on-chip/off-chip timing within a static timer like that shown above using BIO models.

Step 1 is to determine I/O driver delay. To accurately determine I/O driver delay, a static timer such as EinsTimer licensed by IBM or other industry available static timers like PrimeTime by Synopsys and BuildGates by Cadence passes the simulation conditions to the control module 10. These conditions specify the level of modeling required to get the desired level of accuracy. The basic choices are 1) analog such as full device SPICE net list models, 2) combination of analog-digital such as BIO models, and 3) digital such as NDRs. For this example analog-digital simulation techniques are chosen as the optimal balance between simulation speed and accuracy. The simulation conditions also specify the rail voltages, temperature, process corner, input-output edge pair, and input slew rate to the driver.

Step 2 is to supply a SPICE deck. If a SPICE simulation deck 60 does not exist, the control module 10 builds one using the appropriate BIO model 40 and output load 50. The output load describes all silicon, package, and board level parasitics the driver will see.

In Step 3 the control module 10 passes the environmental conditions in the parameter library 20. The environmental conditions being obtained from the simulation condition in the control module.

In Step 4 the parameter library 20 passes BIO model adjustment parameters back to the control module 10 based on the environmental conditions.

In Step 5 the control module (1) passes the adjustment parameters, environment conditions, BIO Parameter and SPICE deck (6) into the SPICE simulation engine (3). Note at this step the analog characteristics of the BIO model have been dynamically adjusted using digital simulation techniques prior to analog simulation The final step, Step 6, is the spice SPICE simulation. Results are then passed back to EinsTimer to be included in static timing reports.

Another application that this mixed-signal simulation provides is the ability for greater accuracy on critical paths. Critical paths could be determined automatically from slack reports or manually via user input. Circuit partitioning for leveraging various simulation engines in a seamless interface is a natural attribute for this system.

Furthermore, the present invention may be implemented in an information handling/computer system. For example, FIG. 9 illustrates a typical hardware configuration of an information handling/computer system for modeling integrated circuits in accordance with the invention.

Figure 9:
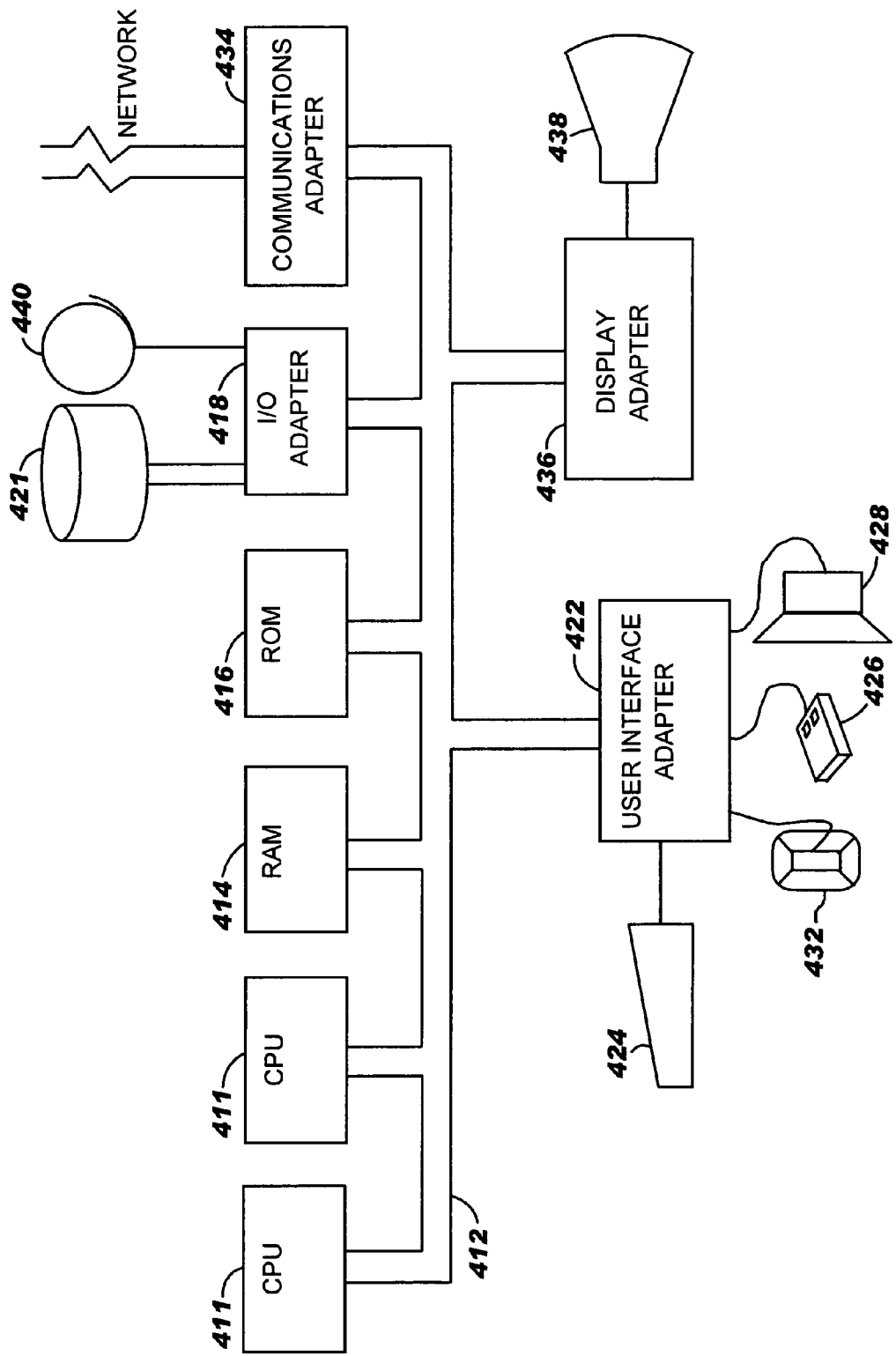
FIG. 9 illustrates a typical hardware configuration of an information handling/computer system for modeling. integrated circuits in accordance with the invention.

As shown in FIG. 9, the inventive information handling/computer system (400) preferably has at least one processor or central processing unit (CPU) 411. The CPUs 411 are interconnected via a system bus 412 to a random access memory (RAM) 414, read-only memory (ROM) 416, input/output (I/O) adapter 418 (for connecting peripheral devices such as disk units 421 and tape drives 440 to the bus 412), user interface adapter 422 (for connecting a keyboard 424, mouse 426, speaker 428, microphone 432, and/or other user interface device to the bus 412), a communication adapter 434 for connecting an information handling system to a data processing network, the Internet, an Intranet, a personal area network (PAN), etc., and a display adapter 436 for connecting the bus 412 to a display device 438 and/or printer 439 (e.g., a digital printer or the like).

In addition to the hardware/software environment described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, comprising signal-bearing media tangibly embodying a program of machine-readable instructions executable by a digital data processor incorporating the CPU 411 and hardware above, to perform the method of the invention.

Figure 10:
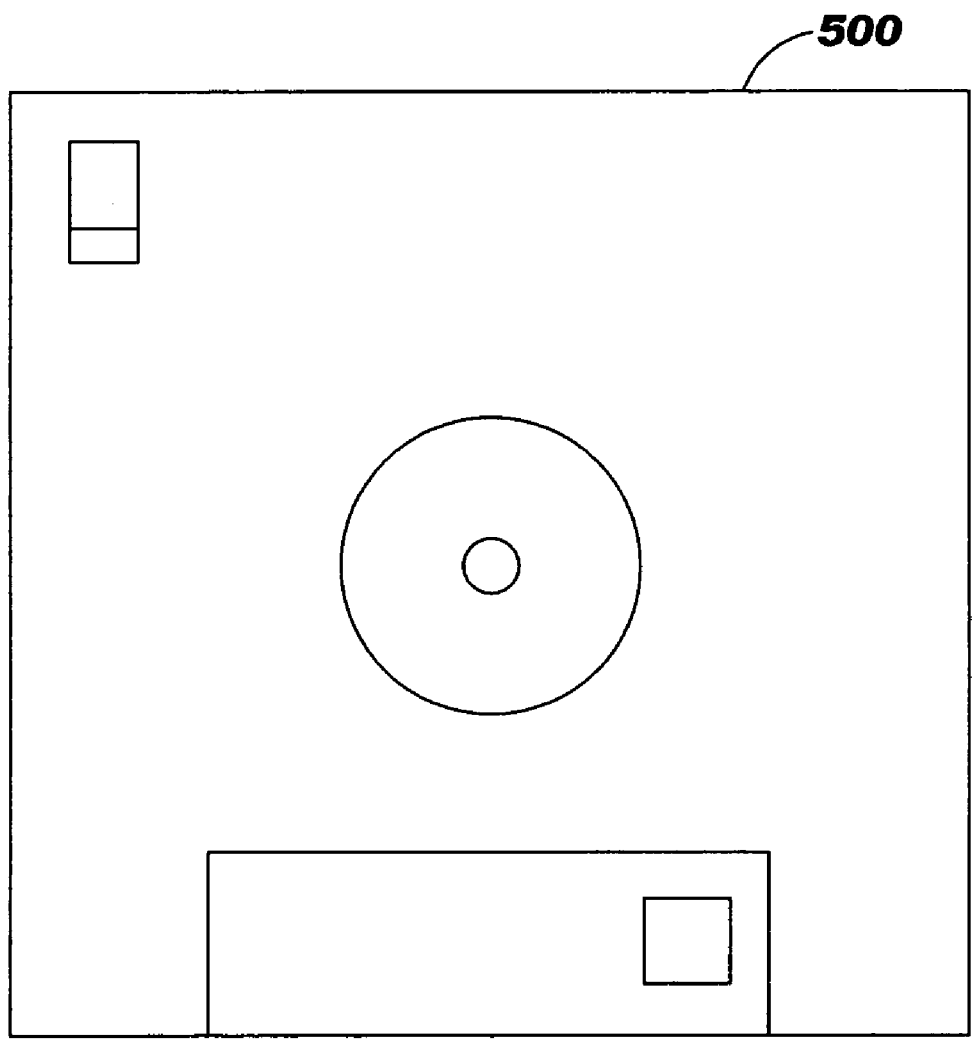
FIG. 10 illustrates an example of signal bearing media.

This signal-bearing media may include, for example, a RAM contained within the CPU 411, as represented by the fast-access storage for example. Alternatively, the instructions may be contained in another signal-bearing media, such as a magnetic data storage diskette 500 (FIG. 10), directly or indirectly accessible by the CPU 411.

Whether contained in the diskette 500, the computer/CPU 411, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g. CD-ROM, WORM, DVD, digital optical tape, etc.), paper "punch" cards, or other suitable signal-bearing media including transmission media such as digital and analog and communication links and wireless. In an illustrative embodiment of the invention, the machine-readable instructions may comprise software object code, compiled from a language such as "C", etc.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method for creating a model of inputs and outputs of integrated circuits, comprising the steps of:
representing in the model, the output characteristics of integrated circuit driver circuits by two types of elements, switching and non-switching;
tabulating the output characteristics for each of the elements by applying a DC voltage source on the output of the driver circuits and measuring the current through each element;
characterizing the switching elements represented as voltage-time controlled resistors by obtaining the product of DC impedance as a function of voltage and scalars that are functions of time; and
embedding in the model, equations that are functions of input edge arrival times and cycle time for each scalar in order to modify behavior of the switching and non-switching elements to fit their environment.

2. The method of claim 1 also comprising the step of:
accounting for variations in temperature and supply voltages in the integrated circuit, wherein the characteristics for the elements are obtained from a dc_base impedance according to the equation: dc_impedance=(1+D0)*dc_base, where D0 is a function of supply voltage and temperature.

3. The method of claim 1 where the step of characterizing the switching elements also comprises the step of: normalizing the resistor's transient impedance to the DC impedance to produce the scalars that are functions of time.

4. The method of claim 1 where the characterization of the switching elements to obtain a transient impedance, includes using a time-varying scalar component measured from the time when an input transition reaches its midpoint value.

5. The method of claim 1 also comprising the step of saving the scalars in a tabular format.

6. The method of claim 1 also comprising the step of generating a periodic waveform from the switching elements by defining a local time as a function of the periodic rise and fall of an input edge arrival time and creating a unique time index with a series of equations, each equation corresponding to a rising or falling input transition.

7. The method of claim 1 also comprising the step of applying a series of indexing equations that incorporate a plurality of modulating parameters to account for variations in environmental conditions.

8. The method of claim 7 wherein the environmental conditions are slew rate, temperature or supply voltage.

9. The method of claim 1 where the switching elements reflect composite transient impedance behavior of a pull-up or pull-down network that are comprised of a plurality of FETs and parasitics.

10. The method of claim 1 where the non-switching elements are an ESD device and a power clamp.

11. The method of claim 1 also comprising modeling a pre-drive current stage or a decoupling stage as any one of the following:
a fixed-value element,
a non-switching element that is a function of parameters not varying in time, or
a switching element that is a function of both time and non-time varying parameters.

12. A method for creating a model of inputs and outputs of integrated circuits, comprising the steps of:
representing in the model, the output characteristics of integrated circuit driver circuits by two types of elements, switching and non-switching;
tabulating the output characteristics for each of the elements by applying a DC voltage source on the output of the driver circuits and measuring the current through each element;
characterizing the switching elements represented as voltage-time controlled resistors by obtaining the product of DC conductance as a function of voltage and scalars that are functions of time; and
embedding in the model, equations that are functions of input edge arrival times and cycle time for each scalar in order to modify behavior of the switching and non-switching elements to fit their environment.

13. The method of claim 12 also comprising the step of:
accounting for variations in temperature and supply voltages in the integrated circuit, wherein the characteristics for the elements are obtained from a dc_base impedance according to the equation: dc_conductance=(1+D0)*dc_base, where D0 is a function of supply voltage and temperature.

14. The method of claim 12 where the step of characterizing the switching elements as a voltage time-controlled resistors also comprises the step of: normalizing the resistor' stransient conductance to the DC conductance to produce the scalar that is a function of time.

15. The method of claim 12 where the characterization of the switching elements to obtain a transient impedance, includes using a time-varying scalar component measured from the time when an input transition reaches its midpoint value.

16. The method of claim 12 also comprising the step of saving the scalars in a tabular format.

17. The method of claim 12 also comprising the step of generating a periodic waveform from the switching elements by defining a local time as a function of the periodic rise and fall of an input edge arrival time and creating a unique time index with a series of equations each equation corresponding to a rising or falling input transition.

18. The method of claim 12 also comprising the step of applying a series of indexing equations that incorporate a plurality of modulating parameters to account for variations in environmental conditions.

19. The method of claim 18 wherein the environmental conditions are slew rate, temperature or supply voltage.

20. The method of claim 12 where the switching elements reflect composite transient conductance behavior of a pull-up or pull-down network that are comprised of a plurality of FETs and parasitics.

21. The method of claim 12 where the non-switching elements are an ESD device and a power clamp.

22. The method of claim 12 also comprising the steps of obtaining behavioral characteristics for a pre-drive current stage linked to the switching elements and a decoupling stage linked to the pre-drive stage, switching and non-switching elements; and applying them to the model.

23. The method of claim 12 which also comprises coupling a pre-drive stage to the switching elements and connecting a decoupling stage to the switching and non-switching elements and the pre-drive stage.

24. The method of claim 12 wherein a fixed value element is used to represent the pre-drive or decoupling stage.

25. The method of claim 12 wherein a non-switching element that is a function of parameters that do not vary in time is used to represent the pre-drive or decoupling stage.

26. The method of claim 12 wherein a switching element which is a function of both time and non-time varying parameters is used to represent the pre-drive or decoupling stage.

27. A method for creating a model of inputs and outputs of integrated circuits, comprising the steps of:

representing in the model, the output characteristics of integrated circuit driver circuits by two types of elements, switching and non-switching;

tabulating the output characteristics for each of the elements by applying a DC voltage source on the output of the driver circuits and measuring the current through each element;

characterizing the switching elements represented as voltage-time controlled resistors by obtaining the product of DC conductance or impedance as a function of voltage and scalars that are functions of time;

accounting for variations in input slew rate, temperature, and supply voltages and their effects on the elements by using a modified local time;

accounting for variations in temperature and supply voltages in the integrated, wherein the characteristics for the elements are obtained from a dc_base impedance, according to the equation: dc_impedance or conductance=(1+D0)*dc_base where D0 is a function of supply voltage and temperature; and embedding in the model, equations that are functions of input edge arrival times and cycle time for each scalar in order to modify behavior of the switching and non-switching elements to fit their environment.

28. A program storage device readable by a machine, tangibly embodying a program of instruction executable by a machine, to perform method steps for creating a model of inputs and outputs of integrated circuits, the method comprising the steps of:

representing in the model, the output characteristics of integrated circuit driver circuits by two types of elements, switching and non-switching;

tabulating the output characteristics for each of the elements by applying a DC voltage source on the output of the driver circuits and measuring the current through each element, characterizing the switching elements as voltage-time controlled resistors by obtaining the product of either DC impedance or conductance as a function of voltage and scalars that are functions of time; and embedding in the model, equations that are functions of input edge arrival times and cycle time for each scalar in order to modify behavior of the switching and non-switching elements to fit their environment.

* * * * *